(12) United States Patent
Chen et al.

(10) Patent No.: US 10,679,541 B2
(45) Date of Patent: Jun. 9, 2020

(54) DISPLAY PANEL

(71) Applicant: AU OPTRONICS CORPORATION, Hsin-Chu (TW)

(72) Inventors: Shao-Ting Chen, Hsin-Chu (TW); Yi-Fan Lin, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/419,117

(22) Filed: May 22, 2019

(65) Prior Publication Data

US 2019/0362666 A1 Nov. 28, 2019

(30) Foreign Application Priority Data

May 25, 2018 (TW) .............................. 107118026 A (51) Int. Cl.
*G09G 3/20* (2006.01)
*H03K 17/693* (2006.01)
*H03K 3/037* (2006.01)

(52) U.S. Cl.
CPC ............... *G09G 3/20* (2013.01); *H03K 3/037* (2013.01); *H03K 17/693* (2013.01); *G09G 2310/0275* (2013.01); *G09G 2310/0289* (2013.01); *G09G 2310/0297* (2013.01)

(58) Field of Classification Search
CPC ......... G09G 3/20; G09G 3/3275–3291; G09G 3/3685–3688; G09G 2310/0275; G09G 2310/0289; G09G 2310/0297; H03K 17/693

See application file for complete search history.

(56) References Cited

U.S. PATENT DOCUMENTS

| | | | |
|---|---|---|---|
| 6,771,238 B1 | 8/2004 | Hiroki | |
| 8,982,031 B2* | 3/2015 | Hung | G09G 3/20 |
| | | | 345/98 |
| 2004/0125065 A1* | 7/2004 | Park | G09G 3/20 |
| | | | 345/92 |
| 2007/0139349 A1 | 6/2007 | Yoon et al. | |

(Continued)

FOREIGN PATENT DOCUMENTS

| | | |
|---|---|---|
| TW | I221541 | 10/2004 |
| TW | 201810219 | 3/2018 |

OTHER PUBLICATIONS

An office action from the TIPO dated Jul. 25, 2019.

*Primary Examiner* — Michael Pervan
(74) *Attorney, Agent, or Firm* — WPAT, PC (57) ABSTRACT

A display panel includes a plurality of data lines and a multiplexer circuit including a first switch set and a second switch set each having a plurality of switches. Each switch of the switch sets has a first end connected to the data lines and a second end. The second ends of a same switch set are connected to each other to form a receiving end connected to a data signal source. The first switch set is turned on alternately by a first clock signal and a second clock signal. The second switch set is turned alternately by a third clock signal and a fourth clock signal. The enabling period of the first clock signal and that of the third clock signal partially overlap and have asynchronous starting times. The enabling period of the second clock signal and that of the fourth clock signal at least partially overlap.

20 Claims, 10 Drawing Sheets

(56) References Cited

U.S. PATENT DOCUMENTS

| | | | |
|---|---|---|---|
| 2012/0056917 A1* | 3/2012 | Ito | G09G 3/3614 |
| | | | 345/691 |
| 2012/0062529 A1* | 3/2012 | Koyama | G09G 3/20 |
| | | | 345/204 |
| 2014/0198135 A1* | 7/2014 | Eom | G09G 3/3275 |
| | | | 345/690 |
| 2015/0061983 A1* | 3/2015 | Kim | G09G 3/3233 |
| | | | 345/82 |
| 2015/0145843 A1* | 5/2015 | Park | G09G 3/20 |
| | | | 345/209 |
| 2015/0170564 A1* | 6/2015 | Kwon | G09G 3/3225 |
| | | | 345/58 |
| 2015/0243209 A1* | 8/2015 | In | G09G 3/3208 |
| | | | 345/76 |
| 2015/0287378 A1* | 10/2015 | Jeong | G09G 3/3688 |
| | | | 345/694 |
| 2016/0293093 A1* | 10/2016 | Seo | G09G 3/20 |
| 2016/0379566 A1* | 12/2016 | Lim | G09G 3/3283 |
| | | | 345/58 |
| 2017/0076665 A1* | 3/2017 | Kim | G09G 3/3225 |
| 2017/0140706 A1* | 5/2017 | Song | G09G 3/3233 |
| 2018/0083078 A1* | 3/2018 | Park | H01L 51/102 |
| 2018/0315368 A1* | 11/2018 | Wen | G09G 3/3611 |

\* cited by examiner

DISPLAY PANEL

FIELD OF THE INVENTION

The present invention relates to a display panel, and specifically, to a display panel with noise reduction design.

BACKGROUND OF THE INVENTION

When a display panel is driven, various drive signals generate noise inside the display panel. For example, noise is often generated when data lines are charged or discharged, when gate drive signals are inputted into the display panel, and when source control signals are inputted from the multiplexer circuit to the data lines. The aforementioned noise may affect the performance of the display panel. For instance, when operating a display panel with a touch function, the foregoing noise may interfere with the transmission and reception of touch signals. Therefore, display panels in the prior art need improvement.

SUMMARY OF THE INVENTION

An objective of the present invention is to provide a display panel to reduce noise in the display panel.

The display panel includes a data signal source, a plurality of data lines, and a multiplexer circuit. The data lines are disposed on a substrate. The multiplexer circuit includes a first switch set and a second switch set. Each switch set includes a plurality of switches. Each switch of the switch sets has a first end and a second end, and the first end is connected to the data lines. The second ends in a same switch set are connected to each other to form a receiving end. The receiving end is connected to the data signal source. The first switch set is turned on alternately according to a first clock signal and a second clock signal. The second switch set is turned on alternately according to a third clock signal and a fourth clock signal. Each clock signal has an enabling period. The enabling period of the first clock signal and the enabling period of the third clock signal partially overlap and have asynchronous starting times. The enabling period of the second clock signal and the enabling period of the fourth clock signal at least partially overlap. A rising edge of the second clock signal is later than a rising edge of the first clock signal. A rising edge of the fourth clock signal is later than a rising edge of the third clock signal.

DETAILED DESCRIPTION OF THE PREFERRED EMBODIMENTS

The spirit of the present invention will be described in the following content with reference to appended drawings. A person skilled in the art can understand the advantages and effects of the present invention from the description disclosed below. However, the content disclosed below is not intended to limit the protection scope of the present invention. The present invention can be implemented by a person skilled in the art based on different perspectives and applications without departing from the concept and spirit of the present invention.

In the description, terms such as "first", "second", and so on do not specifically mean an order or a rank, and are not intended to limit the present invention; instead, such terms are used for distinguishing elements or operations.

Terms such as "comprise", "include", "have", "contain", and so on are not excluding, that is, these terms refer to "include but not limited to".

Unless otherwise specified, the technical terms used in this specification generally have specific meanings as they are used in the art. Some terms used for describing the disclosure will be discussed below or in other parts of this specification so as to provide additional reference for a person skilled in the art in addition to the description of the disclosure.

The following describes the display panel according to the embodiments of the present invention with reference to the accompanying drawings, but the provided embodiments are not used to limit the scope of the present invention.

Figure 1:
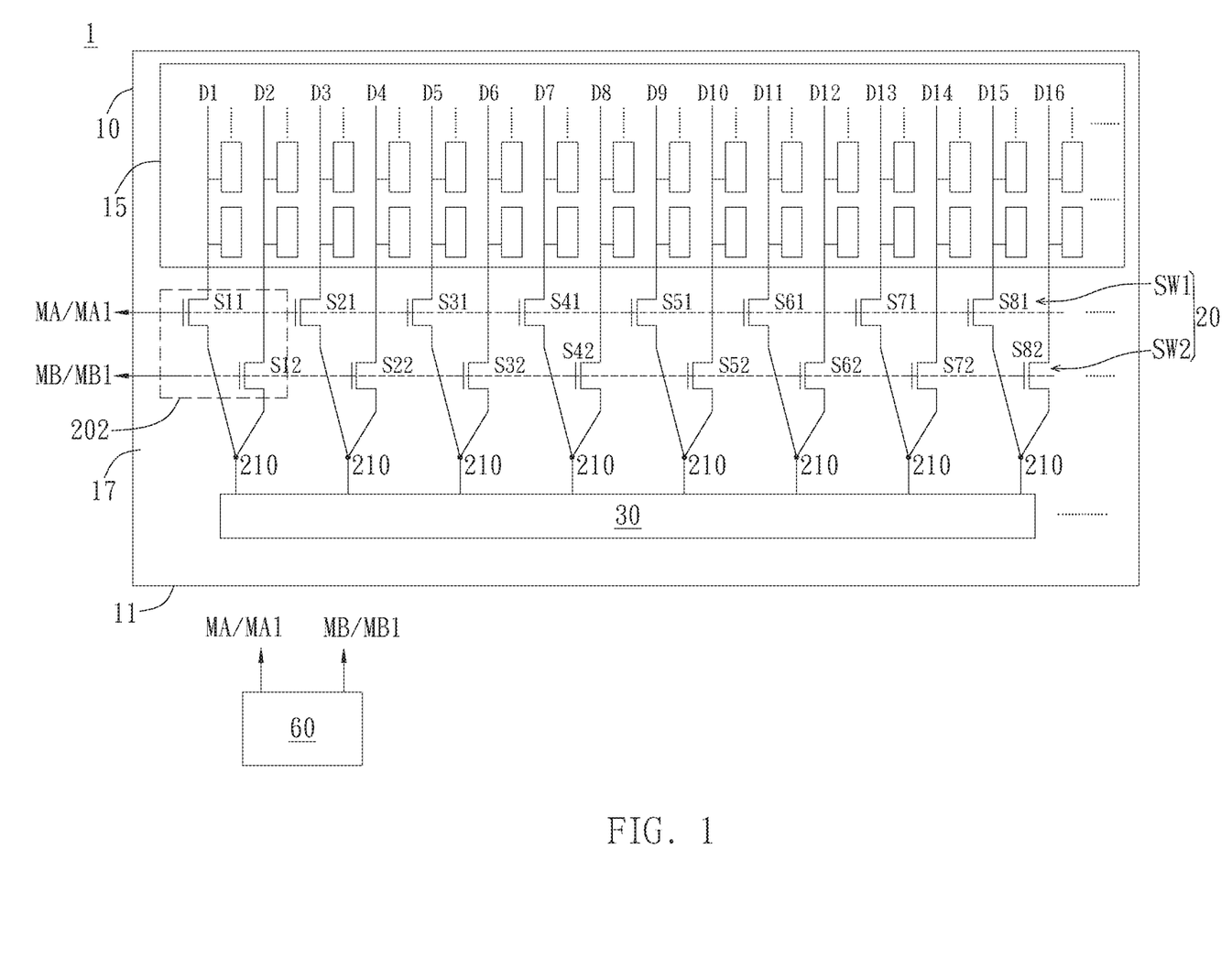
FIG. 1 is a schematic diagram illustrating a display panel according to an embodiment of the present invention.
Figure 1A:
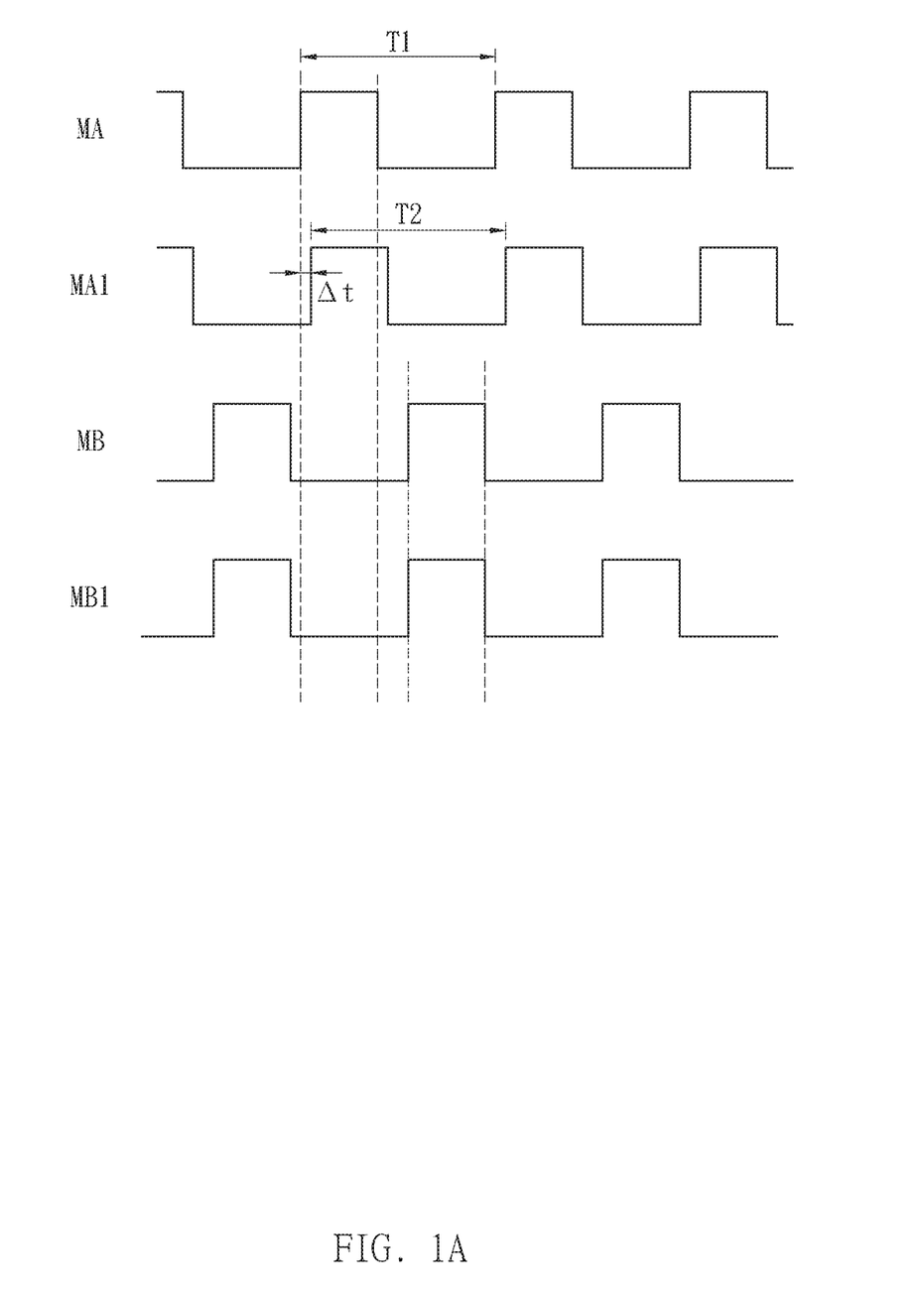
FIG. 1A illustrates the waveforms of the clock signals according to an embodiment of the present invention.

Referring to FIG. 1 and FIG. 1A, the present invention provides a display panel. FIG. 1 is a schematic diagram illustrating the display panel according to an embodiment of the present invention. As shown in FIG. 1, a display panel includes a plurality of data lines (D1 to D16) and a multiplexer circuit 20. The data lines (D1 to D16) are disposed on a substrate 10 and correspondingly distributed in a display area 15. The multiplexer circuit 20 is disposed on a side of a peripheral trace area 17 outside the display area 15. The trace area 17 may be an area formed between a data drive and a display area. The multiplexer circuit 20 includes a plurality of switch sets. Each switch set includes a plurality of switches. For example, in the embodiment of FIG. 1, each switch set includes two switches. A switch S11 and a switch S12 form a switch set 202 (shown in a dashed box), a switch S21 and a switch S22 form another switch set, a switch S31 and a switch S32 form still another switch set, and so on.

As shown in FIG. 1, each switch of the switch sets has a first end, a second end, and a control end. The first end is connected to the data lines. In addition, the second ends of the switches in a same switch set are connected to each other to form a receiving end 210. The switch set formed by the switch S11 and the switch S12 is used as an example. A first end of the switch S11 is connected to a data line D1, and a first end of the switch S12 is connected to a data line D2. The second ends of the switch S11 and the switch S12 are electrically connected to receive a data signal sent by a data signal source. Similarly, the second ends of the switch S21 and the switch S22 are electrically connected to receive the data signal sent by the data signal source.

The control end of each switch receives a clock signal sent by a timing controller 60, to change an on state of the switch according to the clock signal. The clock signals received by the switch S11 and the switch S12 may be two signals substantially phase-inverted in a time interval, or may be two signals partially overlapping in a time interval. The present invention is not limited thereto. Clock signals for turning on a switch set may match the data signal in a waveform. For example, two signals for turning on a switch set partially overlap in a time interval, and the data signal may not be provided in an overlapping period. In other embodiments, two signals for turning on a switch set partially overlap in a time interval, and the data signal may be provided in the overlapping period and serve as a pre-charging period.

The receiving end 210 is connected to the data signal source. For example, a data drive 30 serves as the data signal source. The data drive 30 is disposed along a side 11 of the substrate 10. A switch set formed by switches (S11, S21, . . . , and S81) and a switch set formed by switches (S12, S22, . . . , and S82) are connected to an output pin of the data drive 30, to receive a data signal from the data drive 30.

The multiplexer circuit changes on states of switch sets according to a plurality of clock signals (MA, MB, MA1, and MB1) from the timing controller 60. In this way, the data signal is selectively provided for different data lines. For example, when the clock signal MA turns on the switch S11, the data signal from the data drive 30 is provided for the data line D1. When the clock signal MB turns on the switch S12, the data signal from the data drive 30 is provided for the data line D2. A first switch set and a second switch set are connected to different data lines. For example, the first switch set includes the switch S11 and the switch S12, the switch S11 is electrically connected to the data line D1, and the switch S12 is electrically connected to the data line D2; and the second switch set includes the switch S21 and the switch S22, the switch S21 is electrically connected to a data line D3, and the switch S22 is electrically connected to a data line D4.

The data lines D1 to D4 in this specification are merely used to represent different data lines, rather than define an order or positions of the data lines. The data lines D1 to D4 may be arranged in order, or may be arranged as the data line D1, the data line D3, the data line D2, and the data line D4 from left to right. The present invention is not limited thereto.

As shown in an embodiment of the present invention, the first switches (S11, S21 . . . and S81) in different switch sets are turned on by both the clock signal MA and the clock signal MA1. The switches (S12, S22, . . . , and S82) are turned on by both the clock signal MB and the clock signal MB1. FIG. 1A illustrates the waveforms of the clock signals according to an embodiment of the present invention. As shown in FIG. 1A, in a period T1, the clock signal MA and the clock signal MB are substantially phase-inverted. In a period T2, the clock signal MA1 and the clock signal MB1 are substantially phase-inverted. A switch set is turned on alternately according to the clock signal MA and the clock signal MB, or is turned on alternately according to the clock signal MA1 and the clock signal MB1.

The turning on alternately refers to alternately turning on different switches in a switch set. For example, in the switch set formed of the switch S11 and the switch S12, the clock signal MA turns on the switch S11 and the clock signal MB turns off the switch S12 during a time period. During another time another period, the clock signal MA turns off the switch S11 and the clock signal MB turns on the switch S12.

As shown in FIG. 1A, each clock signal has an enabling period. An enabling period of the clock signal MA and an enabling period of the clock signal MA1 partially overlap and have asynchronous starting times. On the other hand, in the embodiment of FIG. 1A, an enabling period of the clock signal MB and an enabling period of the clock signal MB1 overlap and have synchronous starting times.

Specifically, the clock signal MA and the clock signal MA1 are delayed, a falling edge of the clock signal MA is not aligned with a falling edge of the clock signal MA1, and a rising edge of the clock signal MA is not aligned with a rising edge of the clock signal MA1. In addition, a rising edge of the clock signal MB is later than the rising edge of the clock signal MA, and a rising edge of the clock signal MB1 is later than the rising edge of the clock signal MA1. Switch signal delays (for example, the clock signal MA and the clock signal MA1) are designed in the multiplexer circuit, so that energy can be dispersed when the first switches (S11, S21 . . . and S81) are turned on, to reduce noise generated by turning on the multiplexer circuit.

As shown in an embodiment disclosed by the present invention, the display panel includes a plurality of switch sets, and each switch set may include two switches. Further, as shown in FIG. 1, each switch set includes a first switch and a second switch. For example, in the switch set formed by the switch S11 and the switch S12, the switch S11 is the first switch, and the switch S12 is the second switch, and turning on of the switches are controlled respectively by the clock signal MA and the clock signal MB that are different from each other. That is, the switches (S11, S21 . . . and S81) are first switches, and the switches (S12, S22 . . . and S82) are second switches.

In some subsequent drawings, for ease of description, a switch SW1 drawn by a frame line may represent a set formed by a plurality of first switches, and a switch SW2 drawn by a frame line may represent a set formed by a plurality of second switches. However, the present invention does not limit a quantity of switches of each switch set. In an embodiment, each switch set may include three switches. That is, each switch set may include the switch SW1, the switch SW2, and a switch SW3 (not shown), turning on of a switch SW1, a switch SW2, and a switch SW3 in an switch set are controlled respectively by the clock signal MA, the clock signal MB, and a clock signal MC (not shown) that are different from each other, and turning on of a switch SW1, a switch SW2, and a switch SW3 in another switch set are controlled respectively by the clock signal MA1, the clock signal MB1, and a clock signal MC1 (not shown) that are different from each other.

Figure 2:
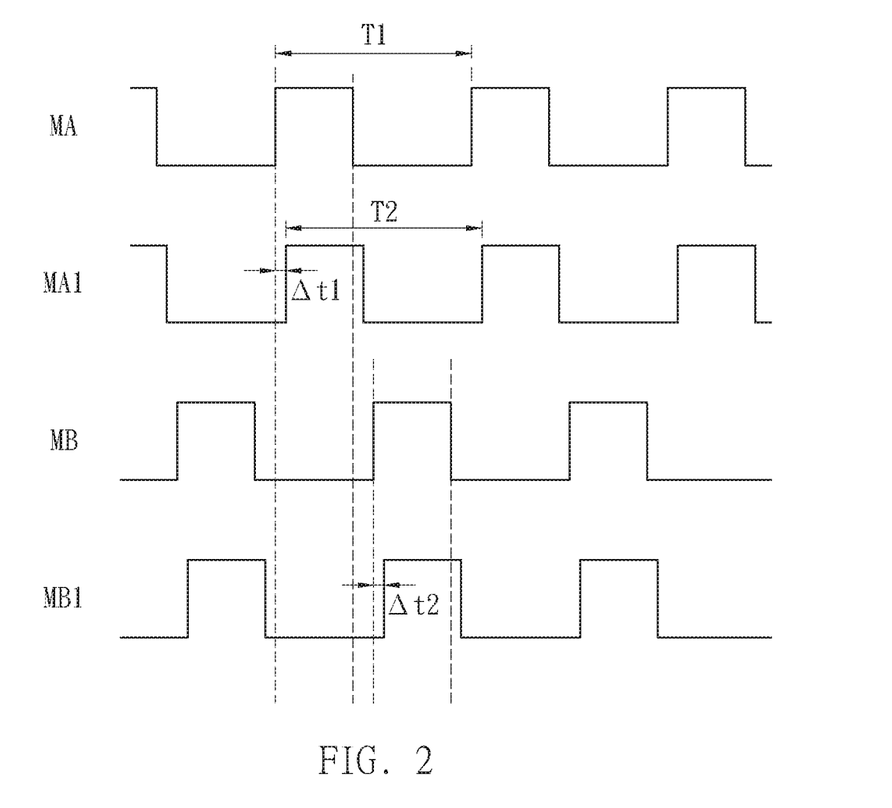
FIG. 2 illustrates the waveforms of the clock signals according to another embodiment of the present invention.

FIG. 2 illustrates the waveforms of the clock signals according to another embodiment of the present invention. As shown in FIG. 2, the clock signal MA and the clock signal MB may be phase-inverted signals, and the clock signal MA1 and the clock signal MB1 may be phase-inverted signals. However, the present invention is not limited thereto. Each clock signal has an enabling period. The enabling period of the clock signal MA and the enabling period of the clock signal MA1 partially overlap and have asynchronous starting times. The enabling period of the clock signal MB and the enabling period of the clock signal MA1 do not overlap. On the other hand, in the embodiment of FIG. 2, the enabling period of the clock signal MB and the enabling period of the clock signal MB1 partially overlap and have asynchronous starting times.

As shown in FIG. 2, an enabling period of each of the clock signals MA, MB, MA1, and MB1 have a rising edge and a falling edge. In other words, the rising edge may be a starting time of an enabling period of a clock signal, and the falling edge may be an end time of the enabling period of the clock signal. The clock signal MA and the clock signal MA1 are used to control turning on of the first switches (S11, S21 . . . and S81) of each switch set. The clock signal MB and the clock signal MB1 are used to control turning on of the second switches (S12, S22 . . . and S82) of each switch set.

The clock signal MA and the clock signal MB may have enabling periods that do not overlap each other or partially overlap. That is, the rising edge of the clock signal MB may be later than or earlier than the falling edge of the clock signal MA, and the enabling periods of the clock signal MA and the clock signal MB may have equal or unequal pulse widths. That is, the enabling period of the clock signal MA may be greater than, less than, or equal to the enabling period of the clock signal MB. The present invention is not limited thereto, and is designed according to an actual design requirement.

The enabling period of the clock signal MA and that of the clock signal MA1 substantially have equal pulse widths. The rising edge of the clock signal MA and the rising edge of the clock signal MA1 have a delay time Δt1. That is, the enabling period of the clock signal MA and that of the clock signal MA1 do not synchronously occur. In an embodiment, the clock signal MA and the clock signal MA1 may be designed so that at least half of the enabling periods do not overlap.

Then referring to the clock signal MB and the clock signal MB1, it should be noted that a delay time Δt2 is provided between the rising edge of the clock signal MB and the rising edge of the clock signal MB1. The delay time Δt2 may be substantially equal or not equal to the delay time Δt1 of the rising edges of the clock signal MA and the clock signal MA1. In an embodiment, the clock signal MB and the clock signal MB1 may be designed so that at least half of enabling periods do not overlap. The waveforms of other clocks signals are similar to those of the clock signals MA and MA1 and the clock signals MB and MB1, and thus the details thereof are not described herein.

Specifically, the clock signal MA and the clock signal MA1 are delayed, and the clock signal MB and the clock signal MB1 are delayed. A falling edge of the clock signal MB is not aligned with a falling edge of the clock signal MB1, and the rising edge of the clock signal MB is not aligned with the rising edge of the clock signal MB1. In addition, the rising edge of the clock signal MB is later than the rising edge of the clock signal MA, and the rising edge of the clock signal MB1 is later than the rising edge of the clock signal MA1. By using signal delays (for example, the clock signal MA and the clock signal MA1, and the clock signal MB and the clock signal MB1), energy can be dispersed when the first switches (S11, S21, . . . , and S81) and the second switches (S12, S22, . . . , and S82) are turned on, to further reduce noise generated by turning on the multiplexer circuit.

Figure 3:
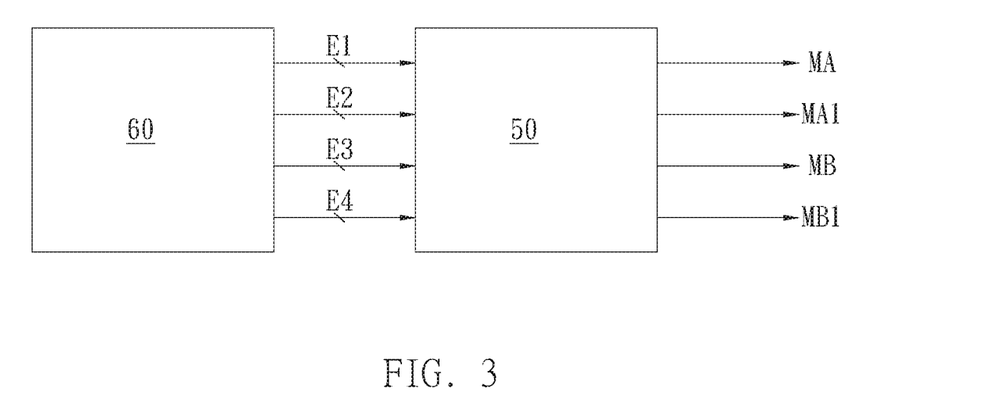
FIG. 3 is a schematic diagram illustrating the generation of clock signals according to one embodiment.

FIG. 3 is a schematic diagram illustrating the generation of clock signals according to one embodiment. In an embodiment, the timing controller 60 transmits the clock signals (MA, MB, MA1, and MB1) to the multiplexer circuit via a level shifter 50. In the embodiment of FIG. 3, the timing controller 60 respectively generates signals (E1, E2, E3, and E4). The signals (E1, E2, E3, and E4) have a delay relationship shown in FIG. 2. The clock signal MA, the clock signal MA1, the clock signal MB, and the clock signal MB1 are generated by the level shifter 50. In other words, a delay relationship between the clock signals may be determined by the timing controller.

Figure 4:
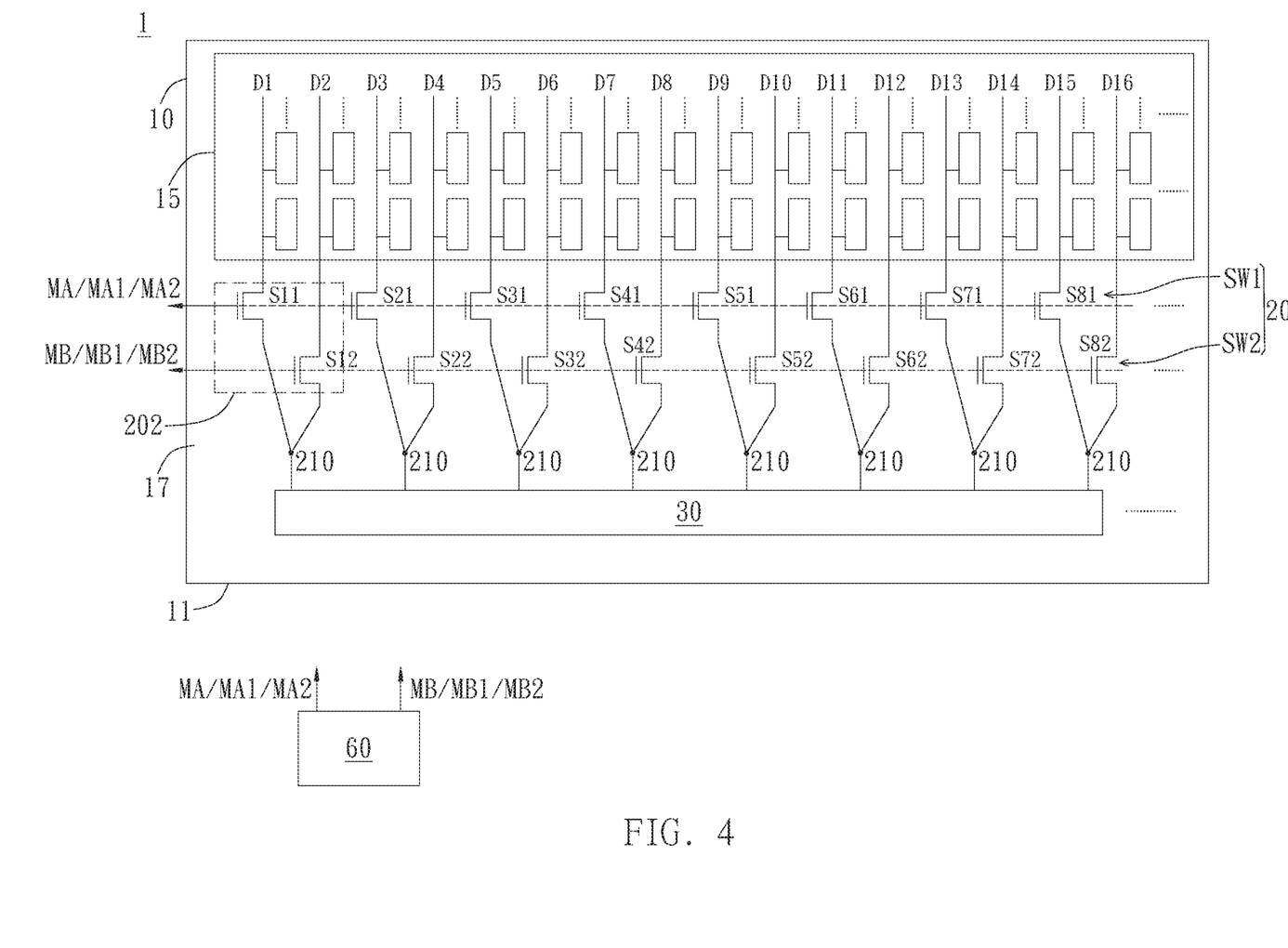
FIG. 4 is a schematic diagram of the display panel according to another embodiment.

FIG. 4 is a schematic diagram of the display panel according to another embodiment. A difference from the foregoing embodiments lies in that the multiplexer circuit receives clock signals (MA, MB, MA1, MB1, MA2, and MB2) to change on states. In the embodiment of FIG. 4, the switches (S11, S21, . . . , and S81) are connected to each other and turned on by the clock signal MA, the clock signal MA1, and the clock signal MA2 together. The switches (S12, S22, . . . , and S82) are connected to each other and turned on by the clock signal MB, the clock signal MB1, and the clock signal MB2 together. It should be noted that control ends of the switches (S11, S21, . . . , and S81) may be in direct connection, and control ends of the switches (S12, S22, . . . , and S82) may be in direct connection, but are limited thereto.

Figure 4A:
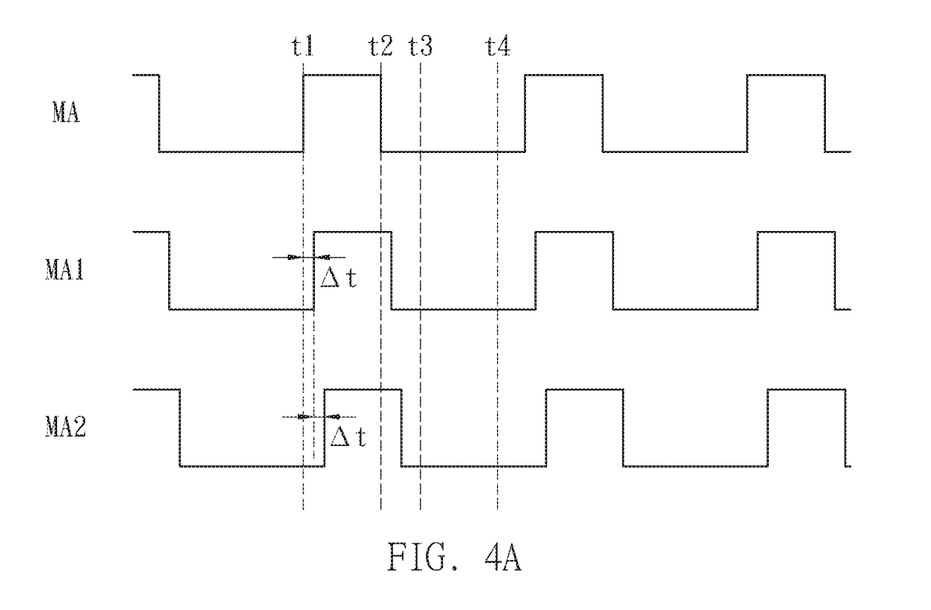
FIG. 4A and FIG. 4B respectively show waveforms of the clock signals turning on the first switches and the second switches.
Figure 4B:
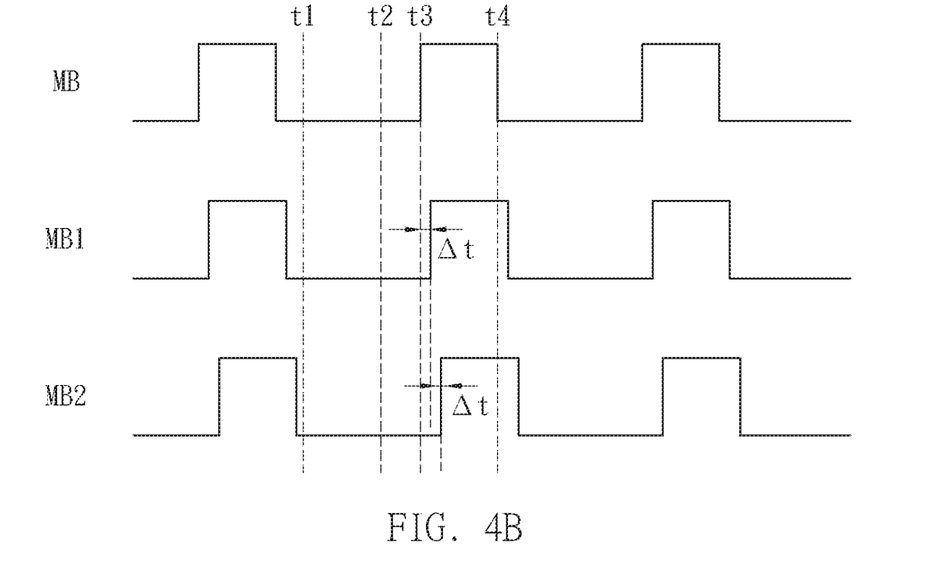

FIG. 4A and FIG. 4B respectively show waveforms of the clock signals turning on the first switches and the second switches. As shown in FIG. 4A and FIG. 4B, the clock signal MA and the clock signal MB may be phase-inverted signals, the clock signal MA1 and the clock signal MB1 may be phase-inverted signals, and the clock signal MA2 and the clock signal MB2 may be phase-inverted signals. However, the present invention is not limited thereto. As shown in FIG. 4A, for example, the clock signal MA is enabled from a time t1 to a time t2 (that is, an enabling period is formed of a rising edge of the time t1 and a falling edge of the time t2). The clock signal MA, the clock signal MA1, and the clock signal MA2 are delayed, the rising edge of the clock signal MA is not aligned with the rising edge of the clock signal MA1, and the falling edge of the clock signal MA is not aligned with the falling edge of the clock signal MA1. The enabling period of the clock signal MA and that of the clock signal MA1 may have equal pulse widths, and a delay time Δt is provided between the rising edge of the clock signal MA and the rising edge of the clock signal MA1. Similarly, the rising edge (the falling edge) of the clock signal MA1 is not aligned with a rising edge (a falling edge) of the clock signal MA2. The enabling period of the clock signal MA1 and that of the clock signal MA2 may have equal pulse widths, and a delay time Δt is provided between the rising edge of the clock signal MA1 and the rising edge of the clock signal MA2. A delay amount of the clock signal MA and the clock signal MA1 may be equal or not equal to a delay amount of the clock signal MA1 and the clock signal MA2.

Similarly, as shown in FIG. 4B, for example, the clock signal MB is enabled from a time t3 to a time t4 (that is, an enabling period is formed of a rising edge of the time t3 and a falling edge of the time t4). The clock signal MB, the clock signal MB1, and the clock signal MB2 are delayed, the rising edge of the clock signal MB is not aligned with the rising edge of the clock signal MB1, and the falling edge of the clock signal MB is not aligned with the falling edge of the clock signal MB1. The enabling period of the clock signal MB and that of the clock signal MB1 may have equal pulse widths, and a delay time Δt is provided between the rising edge of the clock signal MB and the rising edge of the clock signal MB1. Similarly, the rising edge (the falling edge) of the clock signal MB1 is not aligned with the rising edge (a falling edge) of the clock signal MB2. The enabling period of the clock signal MB1 and that of the clock signal MB2 may have equal pulse widths, and a delay time Δt is provided between the rising edge of the clock signal MB1 and the rising edge of the clock signal MB2. A delay amount of the clock signal MB and the clock signal MB1 may be equal or not equal to a delay amount of the clock signal MB1 and the clock signal MB2.

In addition, as shown in FIG. 4A and FIG. 4B, the rising edge (at the time t3) of the clock signal MB is later than the rising edge (at the time t1) of the clock signal MA. The clock signal MB1 and the clock signal MA1, and the clock signal MB2 and the clock signal MA2 also have same relationships. Details are not described herein again. With such design, starting times of the clock signal MA, the clock signal MA1, and the clock signal MA2 for turning on the first switches (S11, S21 . . . and S81) are asynchronous, and energy for turning on the first switches at a same time is small. In addition, starting times of the clock signal MB, the clock signal MB1, and the clock signal MB2 for turning on the second switches (S12, S22 . . . and S82) are asynchronous, and energy for turning on the second switches at a same time is small. Therefore, noise generated by turning on the multiplexer circuit can be further reduced.

Figure 5:
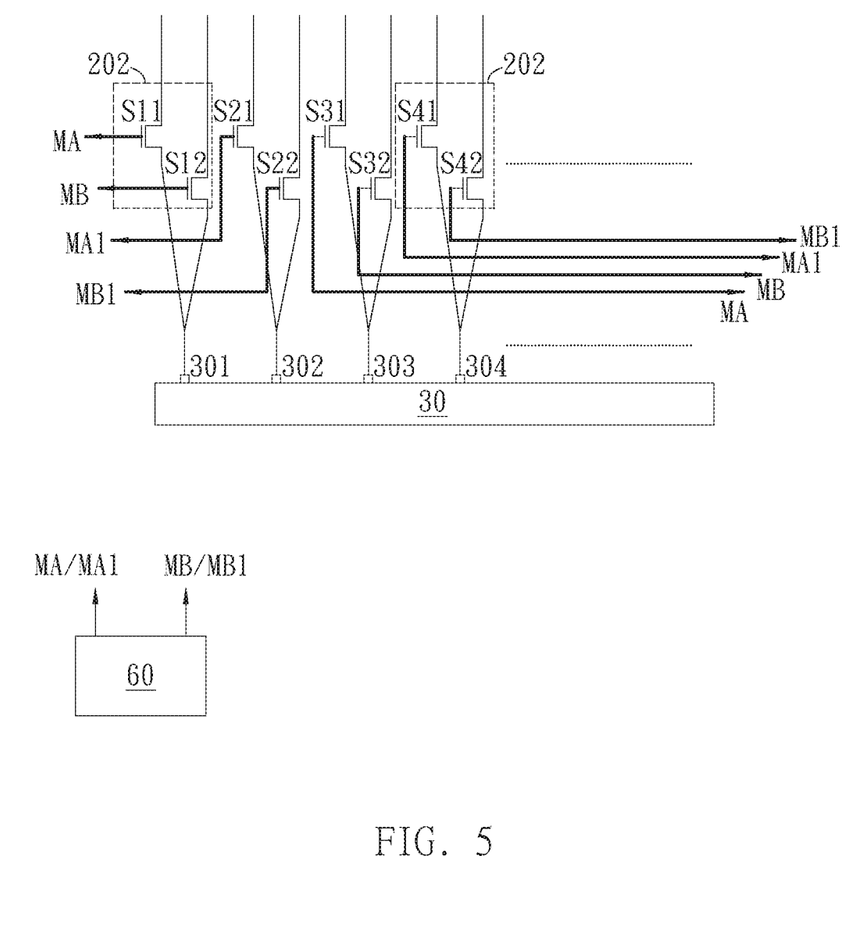
FIG. 5 is a schematic diagram of the display panel according to another embodiment.

FIG. 5 is a schematic diagram of the display panel according to another embodiment. In the embodiment of FIG. 5, the switches (S11, S21 . . . and S41) are not connected to each other, and the switches (S12, S22, . . . , and S42) are not connected to each other. Each switch set includes two switches. The switch S11 and the switch S12 serve as a switch set, the switch S21 and the switch S22 serve as another switch set, and so on. As shown in FIG. 5, the data drive 30 serves as the data signal source, and the timing controller 60 outputs a plurality of clock signals (MA, MA1, MB, and MB1). Control ends of the switches (S11, S21 . . . and S41) and the switches (S12, S22 . . . and S42) are configured to receive the clock signals (MA, MA1, MB, and MB1). An on state of each state is determined by one of the clock signals (MA, MA1, MB, and MB1). The data drive 30 includes output pins (301, 302, 303, and 304) to be used as output ends. The output pin 301 is connected to the switch set 202 formed by the switch S11 and the switch S12. Similarly, the output pin 302 is connected to the switch set formed by the switch S11 and the switch S12. The clock signal MA and the clock signal MB are used to control turning on of a switch set (for example, the switch set 202 formed by the first switch S11 and the second switch S12); and the clock signal MA1 and the clock signal MB1 are used to control turning on of another switch set (for example, the switch set 202 formed by the first switch S41 and the second switch S42). As shown in FIG. 5, the switch set controlled by the clock signal MA and the clock signal MB and the another switch set controlled by the clock signal MA1 and the clock signal MB1 are alternately disposed in a peripheral trace area. That is, turning on of adjacent switch sets are respectively controlled by the clock signals (MA and MB) and the clock signals (MA1 and MB1) that are different from each other.

Figure 6:
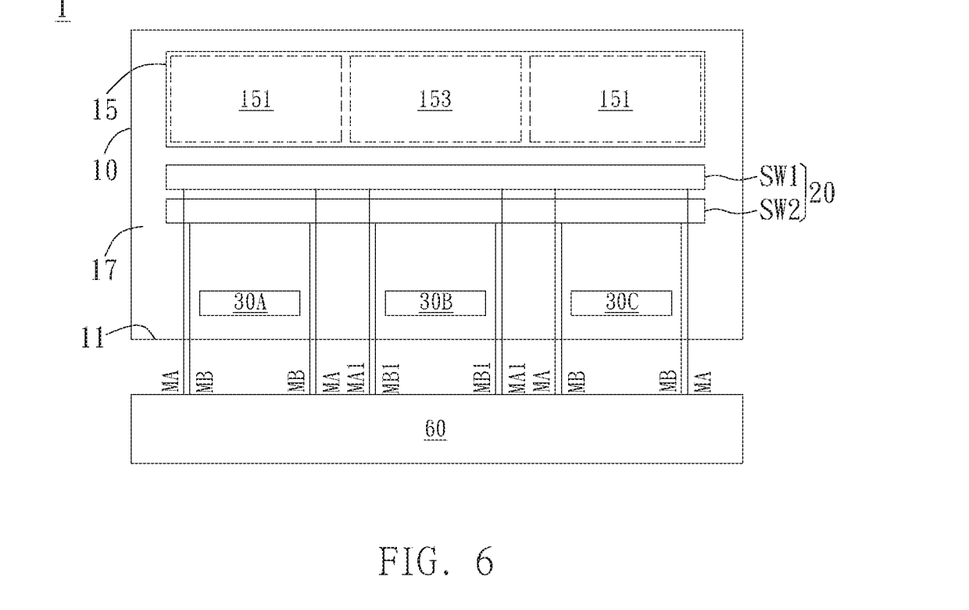
FIG. 6 is a schematic diagram of the display panel according to another embodiment.

FIG. 6 is a schematic diagram of the display panel according to another embodiment. For ease of description, connections between some elements (for example, connections between the multiplexer circuit 20 and data drives (30A, 30B, and 30C)) are omitted. For a specific connection manner, refer to FIG. 1. As shown in FIG. 6, the clock signals (MA, MA1, MB, and MB1) generated by the timing controller 60 may be connected to the multiplexer circuit 20 through a plurality of circuits, and are received by control ends of switches. As shown in FIG. 6, quantities of circuits for transmitting the clock signal MA and the clock signal MA1 may not be averagely allocated. Similarly, quantities of circuits for transmitting the clock signal MB and the clock signal MB1 may not be averagely allocated. In this way, some circuits are changed from originally transmitting the clock signal MA (or MB) to transmitting the clock signal MA1 (or MB1), to provide an energy dispersing effect, and reduce panel noise generated when a switch is turned on. As shown in FIG. 6, switch sets controlled by the clock signal MA and the clock signal MB are disposed in the trace area 17 corresponding to an outer display area 151 (that is, on a side close to a data drive 30A or a data drive 30C), and switch sets controlled by the clock signal MA1 and the clock signal MB1 are disposed in the trace area 17 corresponding to an inner display area 153 (that is, close to a data drive 30B).

Figure 7:
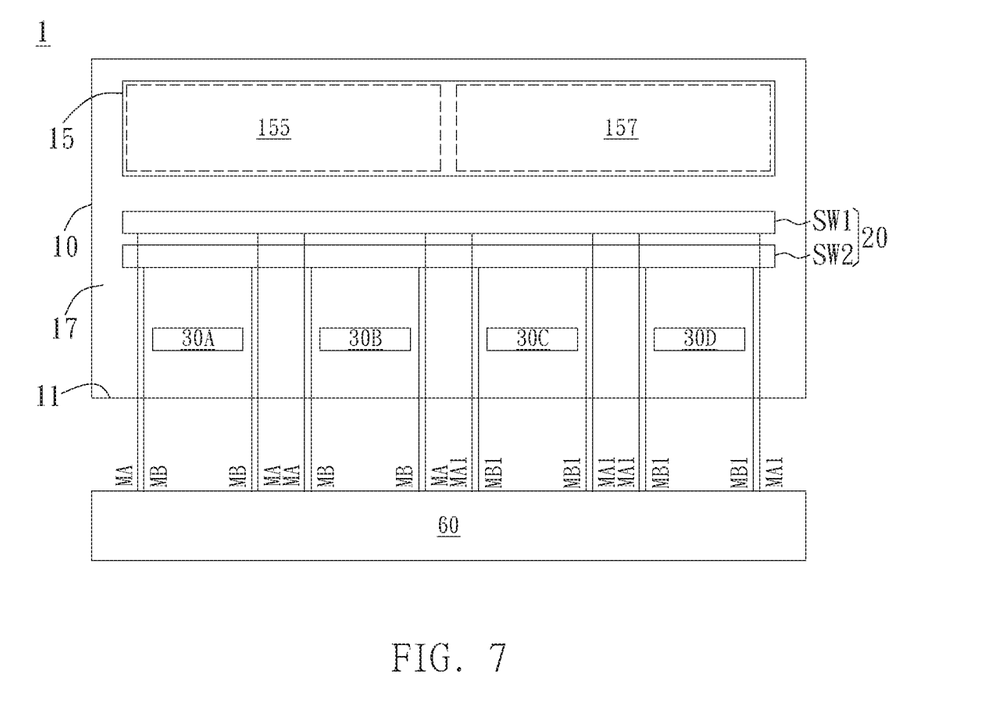
FIG. 7 is a schematic diagram of the display panel according to another embodiment.

FIG. 7 is a schematic diagram of the display panel according to another embodiment. As shown in FIG. 7, the clock signals (MA, MA1, MB, and MB1) generated by the timing controller 60 may be connected to the multiplexer circuit 20 through a plurality of circuits, and are received by control ends of switches. As shown in FIG. 7, quantities of circuits for transmitting the clock signal MA and the clock signal MA1 may be averagely allocated. Similarly, quantities of circuits for transmitting the clock signal MB and the clock signal MB1 may be averagely allocated. In this way, circuits for transmitting the clock signal MA (or MB) are allocated and circuits for transmitting the clock signal MA1 (or MB1) are allocated, so that a quantity of the circuits for transmitting the clock signal MA1 (or MB1) is increased, to further reduce panel noise generated when a switch is turned on. As shown in FIG. 7, the switch sets controlled by the clock signal MA and the clock signal MB are disposed in the trace area 17 corresponding to a first display area 155 of the display area, and switch sets controlled by the clock signal MA1 and the clock signal MB1 are disposed in the trace area 17 corresponding to a second display area 157 of the display area. That is, the switch sets controlled by the clock signal MA and the clock signal MB are disposed in the trace area 17 corresponding to a left half of the display area, and the switch sets controlled by the clock signal MA1 and the clock signal MB1 are disposed in the trace area 17 corresponding to a right half of the display area.

Figure 8:
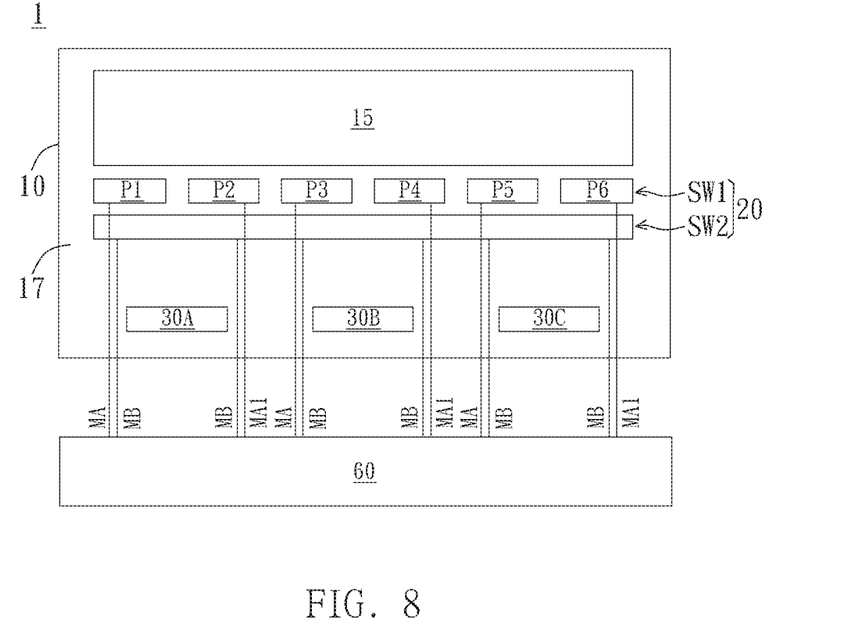
FIG. 8 is a schematic diagram of the display panel according to another embodiment.

FIG. 8 is a schematic diagram of the display panel according to another embodiment. A difference from the embodiment of FIG. 6 lies in that first switches of the switch SW1 of the multiplexer circuit 20 may form a plurality of sections that is not connected to each other according to different received clock signals. As shown in FIG. 8, some first switches of the switch SW1 are connected to each other and divided into a plurality of sections, and circuits connected to a same section transmit same clock signals. For example, a circuit connected to a section P1 transmits the clock signal MA, and a circuit connected to a section P2 transmits the clock signal MA1. In addition, clock signals transmitted by circuits connected to the switch SW2 are all clock signals MB. Therefore, second switches of the switch SW2 are connected to each other and are not divided into sections. By using such design, the first switches receiving the different clock signals are divided into different sections, to reduce possibilities of interference between the different clock signals, and reduce panel noise when the switches are turned on.

Figure 9:
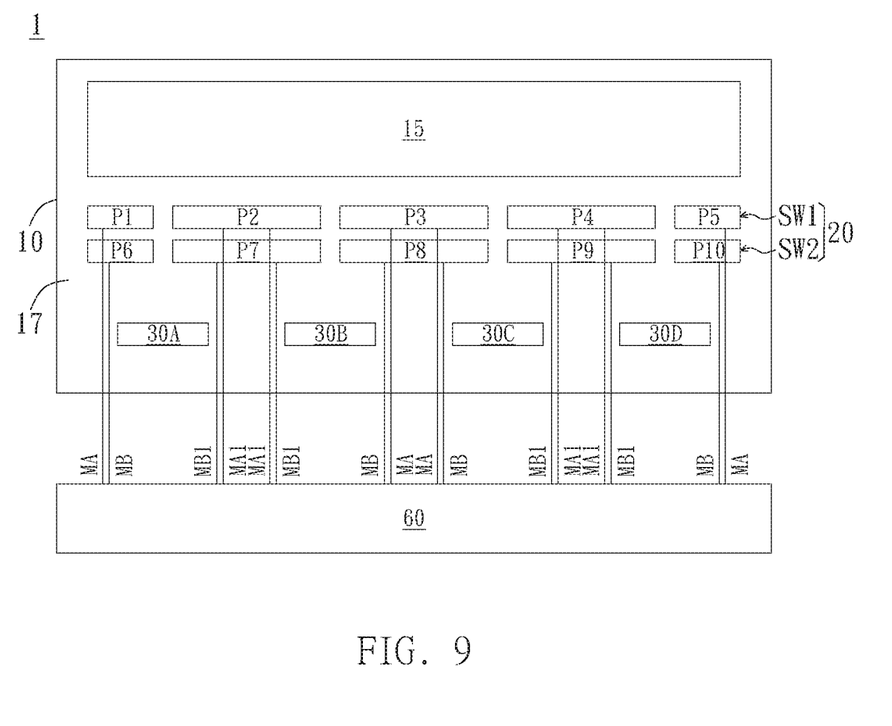
FIG. 9 is a schematic diagram of the display panel according to another embodiment.

FIG. 9 is a schematic diagram of the display panel according to another embodiment. As shown in FIG. 9, in addition to that the first switches are divided into a plurality of sections, the second switches are also divided into a plurality of sections. As shown in FIG. 9, some first switches of the switch SW1 are connected to each other and are divided into a plurality of sections, some second switches of the switch SW2 are connected to each other and are divided into a plurality of sections, and circuits connected to a same section transmit same clock signals. For example, a circuit connected to the section P1 transmits the clock signal MA, and a circuit connected to the section P2 transmits the clock signal MA1. In addition, for clock signals for turning on second switches, for example, a circuit connected to a section P8 transmits the clock signal MB, and a circuit connected to a section P9 transmits the clock signal MB1. With the above mentioned technical solution, first switches receiving different clock signals are divided into different sections, and second switches receiving different clock signals are also divided into different sections, to reduce possibilities of interference between the different clock signals, and reduce panel noise when the switches are turned on.

Figure 10A:
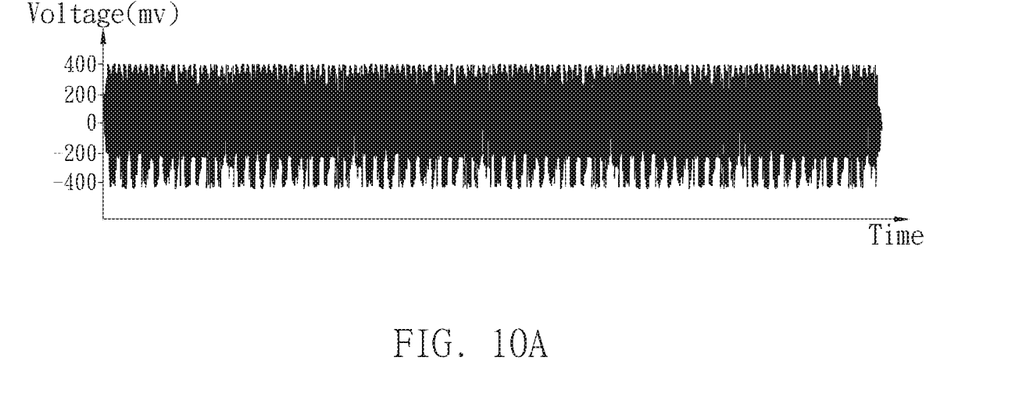
FIG. 10A and FIG. 10B respectively show noise before and after the display panel use the noise reduction design according to the embodiment of the present invention.
Figure 10B:
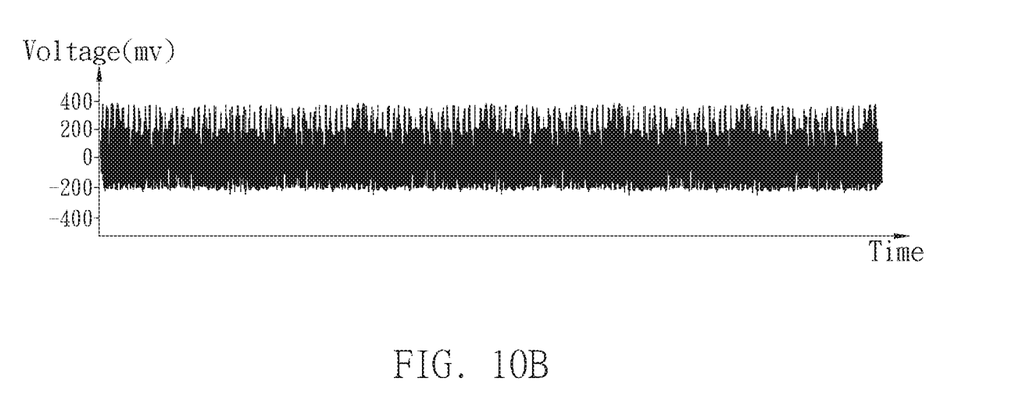

FIG. 10A and FIG. 10B respectively show noise before and after the display panel use the noise reduction design according to the embodiment of the present invention. FIG. 10A represents panel noise when the multiplexer circuit receives only the clock signals (MA and MB), and in this case, an average value of panel noise is measured to be 844 mv. FIG. 10B represents panel noise when the multiplexer circuit receives the clock signals (MA, MA1, MB, and MB1), first switches and second switches in the multiplexer circuit are not divided into sections, and in this case, an average value of panel noise is measured to be 690 mv. It may be learned that adding a delay signal can effectively reduce panel noise.

The foregoing data drives 30A to 30D may be integrated into a data drive chip. The present invention is not limited thereto.

Figure 11:
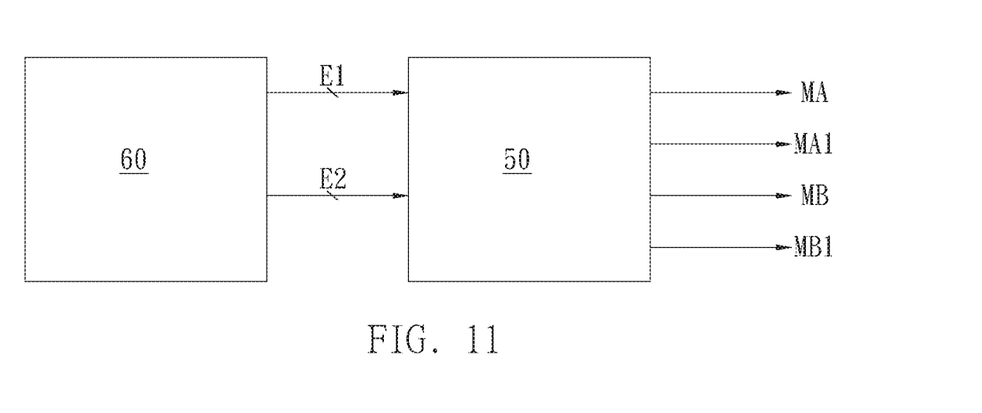
FIG. 11 is another schematic diagram illustrating the generation of clock signals according to one embodiment.

FIG. 11 is another schematic diagram illustrating the generation of clock signals according to one embodiment. In the embodiment of FIG. 11, a delay relationship between clock signals are determined by the level shifter 50. For example, the timing controller 60 respectively generates and outputs the signal E1 and the signal E2 to the level shifter 50 to obtain the clock signal MA, the clock signal MB, the clock signal MA1, and the clock signal MB1. For example, the signal E1 and the signal E2 are outputted successively, and the rising edge of the signal E2 is later than the rising edge of the signal E1. When the timing controller 60 outputs the signal E1 to the level shifter 50, the timing controller 60 respectively generates the clock signal MA and the clock signal MA1 having asynchronous starting times with the level shifter 50. When the timing controller 60 outputs the signal E2 to the level shifter 50, the timing controller 60 respectively generates the clock signal MB and the clock signal MB1 having asynchronous starting times via the level shifter 50.

Figure 12:
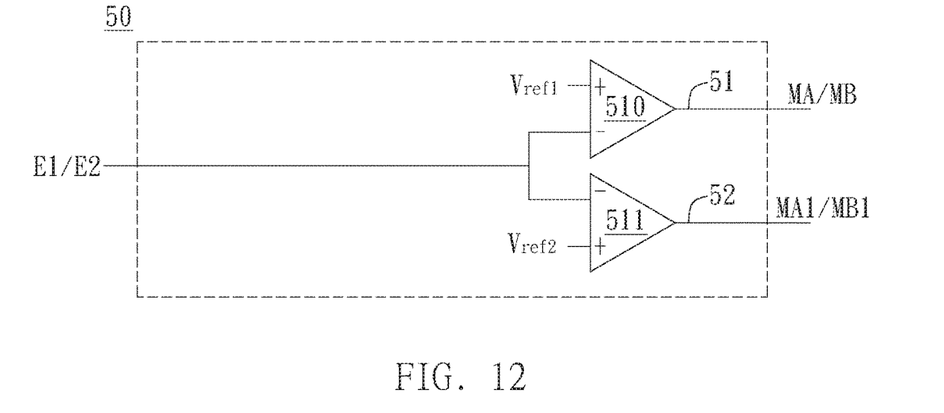
FIG. 12 is a schematic diagram illustrating the level shifter according to one embodiment.
Figure 13:
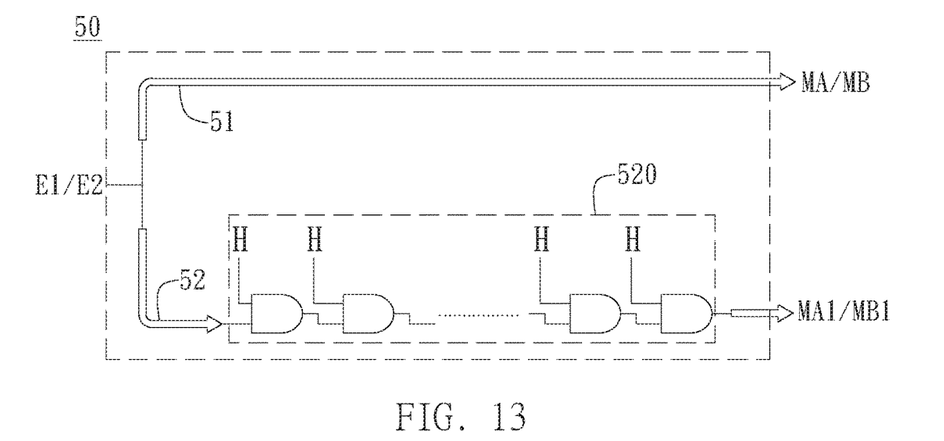
FIG. 13 is a schematic diagram illustrating the level shifter according to another embodiment.
Figure 14:
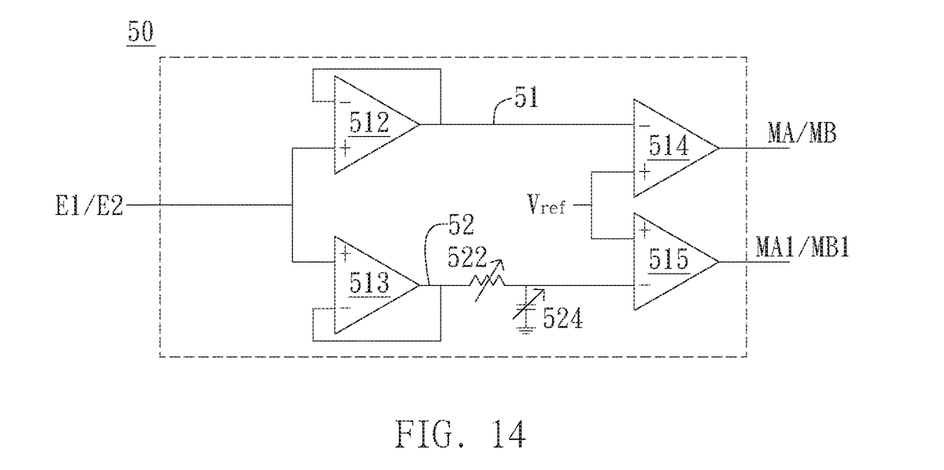
FIG. 14 is a schematic diagram illustrating the level shifter according to another embodiment.

For a manner in which the level shifter generates different clock signals, refer to FIG. 12 to FIG. 14. As shown in FIG. 12, the level shifter 50 has a first transmission path 51 and a second transmission path 52. The first transmission path 51 is set with a first reference voltage Vref1. The second transmission path 52 is set with a second reference voltage Vref2 different from the first reference voltage Vref1. The level shifter 50 adjusts the signal E1 and the signal E2 according to the first reference voltage Vref1 to respectively obtain the clock signal MA and the clock signal MB, and adjusts the signal E1 and the signal E2 according to the second reference voltage Vref2 to respectively obtain the clock signal MA1 and the clock signal MB1. For example, the signal E1 and the signal E2 are output successively. When the level shifter 50 receives the output signal E1, the level shifter 50 obtains the clock signal MA through the first transmission path 51 and by using an operational amplifier 510 and the first reference voltage Vref1, and obtains the clock signal MA1 through the second transmission path 52 and by using an operational amplifier 511 and the second reference voltage Vref2. When the level shifter 50 receives the output signal E2, the level shifter 50 obtains the clock signal MB through the first transmission path 51 and by using the operational amplifier 510 and the first reference voltage Vref1, and obtains the clock signal MB1 through the second transmission path 52 and by using the operational amplifier 511 and the second reference voltage Vref2. In this way, different clock signals are generated.

As shown in FIG. 13, the level shifter 50 has a first transmission path 51 and a second transmission path 52. A plurality of delay elements 520 is disposed on the second transmission path 52. In an embodiment of FIG. 13, the delay elements 520 are a combination of logic gates. The level shifter 50 receives the signal E1 and the signal E2 to respectively obtain the clock signal MA and the clock signal MB, and adjusts the signal E1 and the signal E2 according to the delay elements to respectively obtain the clock signal MA1 and the clock signal MB1. For example, the signal E1 and the signal E2 are output successively. When the level shifter 50 receives the output signal E1, the level shifter 50 obtains the clock signal MA through the first transmission path 51, and obtains the clock signal MA1 through the second transmission path 52 and by using the delay elements 520. When the level shifter 50 receives the output signal E2, the level shifter 50 obtains the clock signal MB through the first transmission path 51, and obtains the clock signal MB1 through the second transmission path 52 and by using the delay elements 520. In this way, different clock signals are generated.

As shown in FIG. 14, the level shifter 50 has the first transmission path 51 and the second transmission path 52. A plurality of delay elements is disposed on the second transmission path 52. In an embodiment of FIG. 14, the delay elements are a combination of a resistor 522 and a capacitor 524. The level shifter 50 receives the signal E1 and the signal E2 to respectively obtain the clock signal MA and the clock signal MB, and adjusts the signal E1 and the signal E2 according to the delay elements to respectively obtain the clock signal MA1 and the clock signal MB1. For example, the signal E1 and the signal E2 are output successively. When the level shifter 50 receives the output signal E1, the level shifter 50 obtains the clock signal MA through the first transmission path 51 and by using an operational amplifier 512, an operational amplifier 514, and a reference voltage Vref, and obtains the clock signal MA1 through the second transmission path 52 and by using an operational amplifier 513, an operational amplifier 515, delay elements (an adjustable resistor and capacitor), and the reference voltage Vref. When the level shifter 50 receives the output signal E2, the level shifter 50 obtains the clock signal MB through the first transmission path 51 and by using the operational amplifier 512, the operational amplifier 514, and the reference voltage Vref, and obtains the clock signal MB1 through the second transmission path 52 and by using the operational amplifier 513, the operational amplifier 515, the delay elements (the adjustable resistor and capacitor), and the reference voltage Vref. Other clock signals may be obtained in a same or similar manner, thereby generating different clock signals.

The present invention has been described with reference to the above embodiments, but the above embodiments are merely examples for implementing the present invention. It should be noted that the disclosed embodiments are not intended to limit the scope of the present invention. On the contrary, any modification and equivalent configuration within the spirit and scope of the appended claims shall fall within the scope of the present invention.

What is claimed is:

1. A display panel, comprising:
a data signal source;
a plurality of data lines, disposed on a substrate; an
a multiplexer circuit, including a first switch set and a second switch set, wherein each switch set has a plurality of switches, each switch of the switch sets having a first end and a second end, in which the first end is connected to the data lines, and the second ends of the plurality of switches in a same switch set are connected to each other to form a receiving end connected to the data signal source,
wherein the first switch set is turned on alternately according to a first clock signal and a second clock signal, and the second switch set is turned on alternately according to a third clock signal and a fourth clock signal,
and wherein each clock signal has an enabling period, the enabling period of the first clock signal and the enabling period of the third clock signal partially overlap and have asynchronous starting times, the enabling period of the second clock signal and the enabling period of the fourth clock signal at least partially overlap, the rising edge of the second clock signal is later than the rising edge of the first clock signal, and the rising edge of the fourth clock signal is later than the rising edge of the third clock signal.

2. The display panel according to claim 1, wherein the enabling period of the second clock signal and the enabling period of the fourth clock signal overlap and have synchronous starting times.

3. The display panel according to claim 1, wherein the enabling period of the second clock signal and the enabling period of the fourth clock signal partially overlap and have asynchronous starting times.

4. The display panel according to claim 3, wherein a falling edge of the second clock signal is not aligned with a falling edge of the fourth clock signal, and a rising edge of the second clock signal is not aligned with a rising edge of the fourth clock signal.

5. The display panel according to claim 1, wherein a falling edge of the first clock signal is not aligned with a falling edge of the third clock signal, and a rising edge of the first clock signal is not aligned with a rising edge of the third clock signal.

6. The display panel according to claim 1, wherein each switch set includes a first switch and a second switch, the display panel further comprising a data driver to be used as the data signal source, the data driver having a first pin and a second pin adjacent to the first pin, in which the first pin is connected to the first switch set, and the second pin is connected to the second switch set.

7. The display panel according to claim 1, further comprising:
a level shifter; and
a timing controller, connected to the multiplexer circuit via the level shifter, and respectively generating the first clock signal, the second clock signal, the third clock signal, and the fourth clock signal.

8. The display panel according to claim 1, further comprising:
a level shifter; and
a timing controller, connected to the multiplexer circuit via the level shifter, and respectively generating and outputting a first signal and a second signal to the level shifter to obtain the first clock signal, the second clock signal, the third clock signal, and the fourth clock signal.

9. The display panel according to claim 8, wherein
the level shifter has a first transmission path set with a first reference voltage, and has a second transmission path set with a second reference voltage different from the first reference voltage; and
the level shifter adjusts the first signal and the second signal according to the first reference voltage to obtain the first clock signal and the second clock signal respectively, and adjusts the first signal and the second signal according to the second reference voltage to obtain the third clock signal and the fourth clock signal respectively.

10. The display panel according to claim 8, wherein
the level shifter has a first transmission path and a second transmission path, and a plurality of delay elements is disposed on the second transmission path; and
the level shifter receives the first signal and the second signal to obtain the first clock signal and the second clock signal respectively, and adjusts the first signal and the second signal according to the delay elements to obtain the third clock signal and the fourth clock signal respectively.

11. The display panel according to claim 10, wherein the delay elements are a combination of logic gates or a combination of a resistor and a capacitor.

12. A display panel, comprising:
a plurality of data lines;
a data driver, configured to provide a data signal;
a first switch set, including a plurality of switches, wherein each of the switches has a first end, a second end, and a gate end, the first end of each of the switches being electrically connected to a corresponding data line, the second ends of the switches being electrically connected to an output end of the data driver to receive the data signal, wherein the gate end of one of the switches is configured to receive a first multiplex signal, and the gate end of another one of the switches is configured to receive a second multiplex signal, in which the multiplex signals each have an enabling period formed of a rising edge and a falling edge, and at least half of the enabling periods of the multiplex signals do not overlap; and
a second switch set, including a plurality of switches, wherein each of the switches has a first end, a second end, and a gate end, the first end of each of the switches being electrically connected to a corresponding data line, the second ends of the switches being electrically connected to another output end of the data driver to receive the data signal, wherein the gate end of one of the switches is configured to receive a third multiplex signal, and the gate end of another one of the switches is configured to receive a fourth multiplex signal, in which the multiplex signals each have an enabling period formed of a rising edge and a falling edge, and at least half of the enabling periods of the multiplex signals do not overlap, wherein most part of the enabling period of the first multiplex signal overlaps most part of the enabling period of the third multiplex signal, in which the enabling period of the first multiplex signal and the enabling period of the third multiplex signal substantially have equal widths, and a first delay time is provided between a rising edge of the first multiplex signal and a rising edge of the third multiplex signal; and most part of the enabling period of the second multiplex signal overlaps most part of the enabling period of the fourth multiplex signal, in which the enabling period of the second multiplex signal and the enabling period of the fourth multiplex signal substantially have equal widths, and a second delay time is provided between a rising edge of the second multiplex signal and a rising edge of the fourth multiplex signal.

13. The display panel according to claim 12, wherein the first delay time is equal to the second delay time.

14. The display panel according to claim 12, wherein the enabling period of the first multiplex signal and that of the second multiplex signal do not overlap, and the enabling period of the third multiplex signal and that of the fourth multiplex signal do not overlap.

15. The display panel according to claim 12, wherein the first switch set includes three switches, in which the gate end of still another one of the switches is configured to receive a fifth multiplex signal, and the second switch set includes three switches, in which the gate end of still another one of the switches is configured to receive a sixth multiplex signal.

16. A display panel, comprising:
a plurality of data lines, disposed in a display area;
a data driver, configured to provide a data signal;
a plurality of first switch sets, disposed in a trace area, wherein each of the first switch sets includes a plurality of switches, each of the switches having a first end, a second end, and a gate end, wherein the first end of each of the switches is electrically connected to a corresponding data line, the second ends of the switches are electrically connected to an output end of the data drive to receive the data signal, the gate end of one of the switches is configured to receive a first multiplex signal, and the gate end of another one of the switches is configured to receive a second multiplex signal, and wherein the multiplex signals each have an enabling period formed of a rising edge and a falling edge, in which at least half of the enabling periods of the multiplex signals do not overlap; and a plurality of second switch sets, disposed in the trace area, wherein each of the second switch sets includes a plurality of switches, each of the switches having a first end, a second end, and a gate end, wherein the first end of each of the switches is electrically connected to a corresponding data line, the second ends of the switches are electrically connected to another output end of the data driver to receive the data signal, the gate end of one of the switches is configured to receive a third multiplex signal, the gate end of another one of the switches is configured to receive a fourth multiplex signal, and wherein the multiplex signals each have an enabling period formed of a rising edge and a falling edge, in which at least half of the enabling periods of the multiplex signals do not overlap, wherein most part of the enabling period of the first multiplex signal overlaps most part of enabling period of the third multiplex signal, the enabling period of the first multiplex signal and the enabling period of the third multiplex signal substantially have equal widths, and a first delay time is provided between a rising edge of the first multiplex signal and a rising edge of the third multiplex signal, and most part of the enabling period of the second multiplex signal overlaps most part of the enabling period of the fourth multiplex signal, the enabling period of the second multiplex signal and the enabling period of the fourth multiplex signal substantially have equal widths, and a second delay time is provided between a rising edge of the second multiplex signal and a rising edge of the fourth multiplex signal.

17. The display panel according to claim 16, wherein the first switch sets and the second switch sets are alternately disposed in the trace area.

18. The display panel according to claim 16, wherein the first switch sets are disposed in the trace area corresponding to a first display area of the display area, and the second switch sets are disposed in the trace area corresponding to a second display area of the display area.

19. The display panel according to claim 16, wherein the enabling period of the first multiplex signal and the enabling period of the second multiplex signal do not overlap, and the enabling period of the third multiplex signal and the enabling period of the fourth multiplex signal do not overlap.

20. The display panel according to claim 16, wherein the first switch set includes three switches, in which the gate end of still another one of the switches is configured to receive a fifth multiplex signal, and the second switch set includes three switches, in which the gate end of still another one of the switches is configured to receive a sixth multiplex signal.

* * * * *